(12) United States Patent
Fan et al.

(10) Patent No.: US 7,791,896 B1
(45) Date of Patent: Sep. 7, 2010

(54) PROVIDING AN EMBEDDED CAPACITOR IN A CIRCUIT BOARD

(75) Inventors: Jun Fan, San Marcos, CA (US); James L. Knighten, Poway, CA (US); Norman W. Smith, San Marcos, CA (US)

(73) Assignee: Teradata US, Inc., Miamisburg, OH (US)

( * ) Notice: Subject to any disclaimer, the term of this patent is extended or adjusted under 35 U.S.C. 154(b) by 403 days.

(21) Appl. No.: 11/820,570

(22) Filed: Jun. 20, 2007

(51) Int. Cl.
*H05K 1/16* (2006.01)

(52) U.S. Cl. .................................... 361/765; 174/261

(58) Field of Classification Search .................. 361/765, 361/760, 761, 763, 764, 780; 174/261, 266, 174/265
See application file for complete search history.

(56) References Cited

U.S. PATENT DOCUMENTS

| | | | |
|---|---|---|---|
| 4,436,953 A | 3/1984 | Gottlieb | |
| 5,027,253 A | 6/1991 | Lauffer et al. | |
| 5,261,153 A | 11/1993 | Lucas | |
| 5,796,587 A | 8/1998 | Lauffer et al. | |
| 5,953,203 A | 9/1999 | Tormey et al. | |
| 6,068,782 A | 5/2000 | Brandt et al. | |
| 6,198,362 B1 | 3/2001 | Harada et al. | |
| 6,256,850 B1 | 7/2001 | Lauffer et al. | |
| 6,329,590 B1 | 12/2001 | Alexander et al. | |
| 6,388,207 B1 | 5/2002 | Figueroa et al. | |
| 6,407,929 B1 | 6/2002 | Hale et al. | |
| 6,512,182 B2 | 1/2003 | Takeuchi et al. | |
| 6,611,419 B1 | 8/2003 | Chakravorty | |
| 6,621,012 B2 | 9/2003 | Crockett et al. | |
| 6,713,860 B2 | 3/2004 | Li | |
| 6,844,505 B1 * | 1/2005 | Fan et al. | 174/260 |
| 7,230,815 B2 * | 6/2007 | Yoon et al. | 361/303 |
| 2004/0174656 A1 * | 9/2004 | MacNeal et al. | 361/306.3 |
| 2009/0161292 A1 * | 6/2009 | Kim | 361/321.2 |
| 2009/0231779 A1 * | 9/2009 | Aoki | 361/301.4 |

OTHER PUBLICATIONS

Fan et al., U.S. Appl. No. 10/670,829, entitled "Providing Decoupling Capacitors in a Circuit Board," filed Sep. 25, 2003, pp. 1-18, Figs. 1-5.
Alexander et al., U.S. Appl. No. 10/630,886, entitled "Providing a Resistive Element Between Reference Plane Layers in a Circuit Board," filed Jul. 30, 2003, pp. 1-21, Figs. 1-11.
http://www.chipscalereview.com/issues/0802/patents.html, Chip Scale Review Online, "Embedded Capacitors Improve Overall device Performance," pp. 1-2 (at least as early as Feb. 10, 2004).

* cited by examiner

*Primary Examiner*—Jeremy C Norris
*Assistant Examiner*—Yuriy Semenenko
(74) *Attorney, Agent, or Firm*—Trop, Pruner & Hu P.C.

(57) ABSTRACT

A circuit board includes power reference layers and a capacitor provided between the power reference layers such that a shorter dimension of the capacitor defines a space between the power reference layers. The capacitor has plural conductive plates and plural dielectric layers.

12 Claims, 5 Drawing Sheets

PROVIDING AN EMBEDDED CAPACITOR IN A CIRCUIT BOARD

BACKGROUND

A circuit board (sometimes referred to as a printed circuit board or a printed wiring board) is the basic building block for interconnecting electronic devices in a system. Electronic devices, usually integrated circuit (IC) devices, are mounted onto the circuit boards using a number of mounting mechanisms, such as by use of connectors or by directly mounting the devices onto a surface of the circuit board. A circuit board also includes the wiring required to interconnect the devices electrically.

The number and density of signal lines in a circuit board are continuously increasing due to the increased density of circuits that can be formed on each IC chip. The number of input/output (I/O) pins that exist on each IC chip can be quite large, which means that a large number of signal wires are used to carry signals from one IC chip to another component in the system. To increase the density of signal wires that can be provided in the circuit board, a circuit board is usually formed of multiple layers. Some layers contain signal wires for transmitting signals, while other layers contain power reference planes, which are connected to ground or to a power supply voltage, e.g., a three-volt voltage, a five-volt voltage, or some other power supply voltage. In other arrangements of circuit boards, power reference planes are not used.

With large numbers of IC chips and signal wires (I/O circuits) in a circuit board, switching noise can be a problem during system operation, especially at high frequencies. To mitigate switching noise, surface mount technology (SMT) decoupling capacitors can be used. These capacitors can be mounted to either the primary or secondary (top or bottom) surface of the circuit board, and connected to reference planes through vias. At high frequencies, a capacitor provides a low impedance bypass path for switching noise between the power supply voltage plane and the ground plane.

In other implementations, SMT decoupling capacitors can be embedded between layers of a circuit board. Conventionally, SMT capacitors usually have a parallelepiped geometric shape provided in a manner in which the capacitor is taller than it is wide. To reduce spacing between layers of the circuit board, the capacitors when embedded in a circuit board are mounted on their sides (in a horizontal configuration rather than a vertical configuration).

However, an issue presented by placing an SMT capacitor on its side is that the conductive electrodes of the capacitor provided on the top and bottom of the capacitor may short circuit power reference layers that sandwich the SMT capacitor. An example of such a conventional arrangement is depicted in FIG. 1, which shows an SMT capacitor 10 placed on its side (note that the length L of the capacitor 10 is greater than its width W). The SMT capacitor 10 has a first conductive electrode 12 and a second conductive electrode 14. The SMT capacitor 10 is provided between power reference layers 16 and 18 of a circuit board. The electrode 12 is electrically contacted to the power reference layer 18, and the electrode 14 is electrically contacted to the power reference layer 16. To prevent undesired shorting of the electrode 12 to the power reference layer 16, an insulating layer 20 is provided between the electrode 12 and the power reference layer 16, and to prevent undesired shorting of the electrode 14 to the power reference layer 18, another insulating layer 22 is provided between the electrode 14 and the power reference layer 18. Shorting of the capacitor electrode 12 to the power reference layer 16 or shorting of the capacitor electrode 14 to the power reference layer 18 will cause the power reference layers 16 and 18 to be shorted to each other through the capacitor electrode.

An issue associated with the arrangement of FIG. 1 is that having to provide the insulating layers 20 and 22 adds complexity (and therefore cost) to the manufacturing process of a circuit board. If the insulating layers 20 and 22 are not properly positioned, undesired shorting can still occur between capacitor electrodes 12, 14 and power reference layers 16, 18.

SUMMARY

In general, according to embodiment, a capacitor that is embedded between power reference layers of a circuit board is positioned such that a smaller dimension of the capacitor is provided between the power reference layers, while conductive electrodes of the capacitor are positioned to face respective power reference layers to avoid shorting the power reference layers.

Other or alternative features will become apparent from the following description, from the drawings, and from the claims.

DETAILED DESCRIPTION

In the following description, numerous details are set forth to provide an understanding of the present invention. However, it will be understood by those skilled in the art that the present invention may be practiced without these details and that numerous variations or modifications from the described embodiments may be possible.

Figure 1:
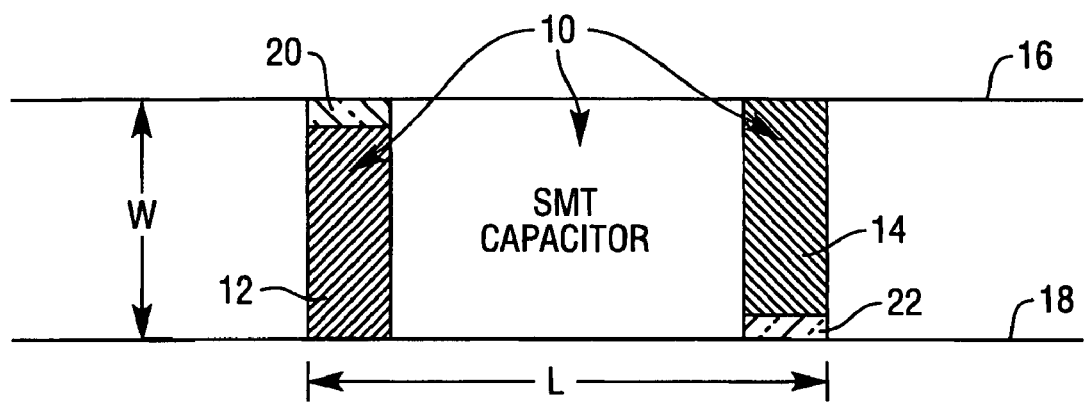
FIG. 1 illustrates a conventional arrangement of a surface mount technology (SMT) capacitor placed between power reference layers of a circuit board.
Figure 2:
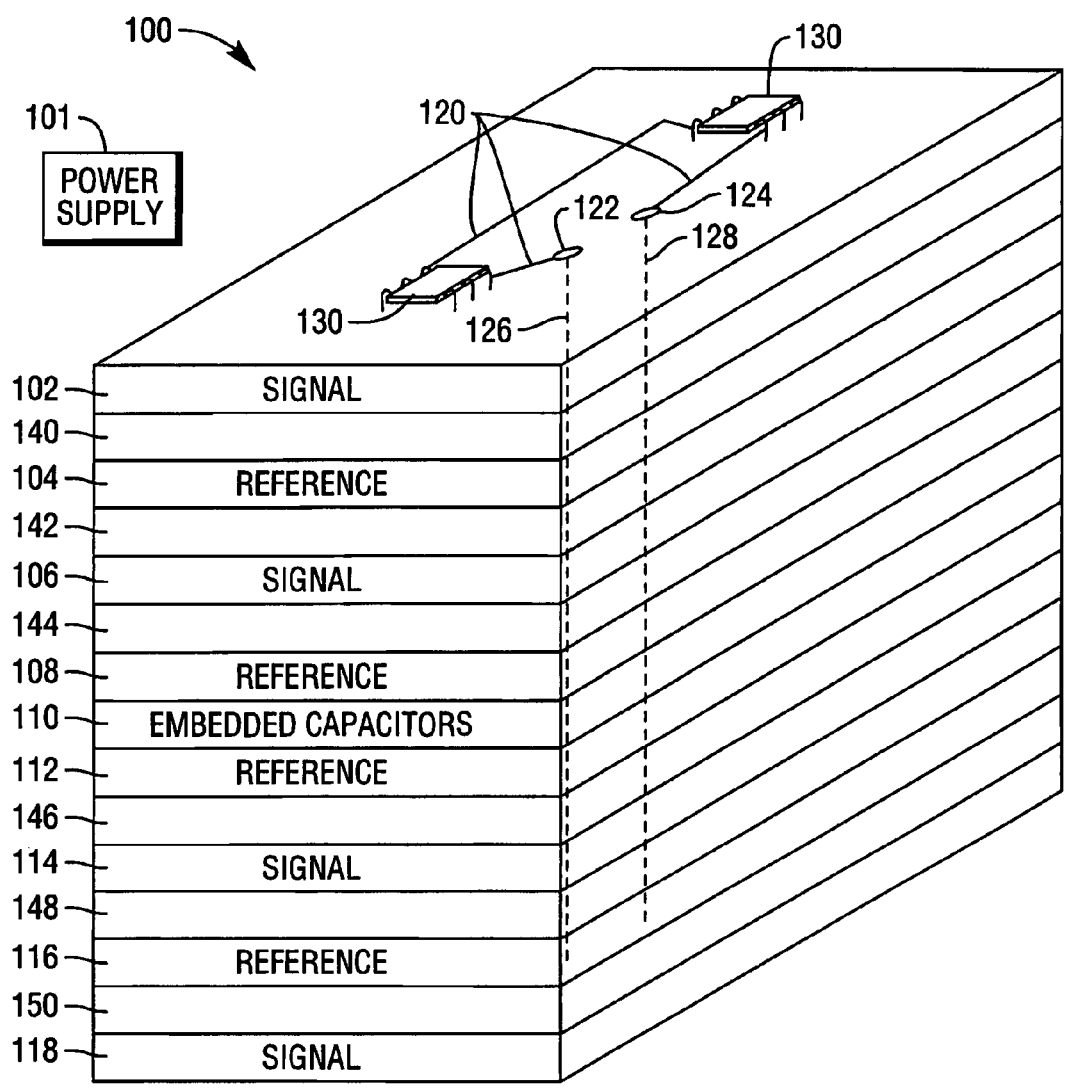
FIG. 2 illustrates an example circuit board having embedded SMT capacitors according to some embodiments.

As shown in FIG. 2, an example circuit board 100 includes multiple layers 102, 104, 106, 108, 112, 114, 116, and 118. In other implementations, a larger or smaller number of layers can be used in the circuit board. As used here, a "circuit board" refers to any structure containing signal wires or conductors (for routing signals) and containing power reference planes (to carry ground and power supply voltages). Examples of a "circuit board" include printed wiring boards (PWBs) and printed circuit boards (PCBs). A "circuit board" also covers any package, such as an integrated circuit (IC) package, that has multiple layers of signal wires or conductors and power reference planes. The circuit board 100 is part of a system that includes various components, such as a hard disk drive, a display, a central processing unit (CPU), a power supply 101, and so forth. The components (e.g., devices 130) are mounted on one surface (or both a top and bottom surface) of the circuit board 100.

In the example shown in FIG. 2, the layers 102, 106, 114, and 118 are signal layers for carrying signal wires, while the layers 104, 108, 112, and 116 are power reference plane layers that contain either a ground plane or a power supply voltage plane connected to a power supply voltage (e.g., 3 volts, 5 volts, 12 volts, etc.) produced by the power supply 101. Dielectric layers 140, 142, 144, 110, 146, 148, and 150 are provided between successive signal and/or reference plane layers. The dielectric layers are insulator layers to isolate electrical conductors in the circuit board.

The dielectric layer 110 contains multiple decoupling capacitors embedded between power reference layers to provide a bypass path for switching noise between a power supply voltage plane and ground plane. Thus, in the example of FIG. 2, one of the reference layers 108 and 112 is a ground reference layer, while the other one of the reference layers 108 and 112 is a power supply voltage reference layer. The embedded decoupling capacitors in the dielectric layer 110 each has electrodes that are electrically contacted to corresponding power reference layers 108 and 112. In addition to noise mitigation, the embedded decoupling capacitors can also store charge such that adequate charge delivery is provided to active devices when they change state.

In some implementations, the embedded capacitors are discrete capacitors, which can be surface mount technology (SMT) capacitors. As used here, SMT refers to the type of capacitor used, not to the mounting mechanism of the capacitor. In fact, the SMT capacitors are buried or embedded within an inner layer of the circuit board and not mounted to an external surface of the circuit board. A benefit of using SMT capacitors is that they can be "off-the-shelf" discrete IC components that are readily available. Each of such off-the-shelf capacitors has an outer package or protective housing to surround the capacitor components. Electrodes protrude from the package to enable connection of each discrete capacitor to other components in the circuit board. In other implementations, other types of discrete capacitors can be used, such as round or circular capacitors. The term "discrete capacitors" generally refers to capacitors that have separate electrodes and dielectric layers; in other words, two capacitors are discrete if they do not share any of their electrodes and dielectric layer with one another.

Although only one assembly of the dielectric layer 110 with embedded capacitors is shown in FIG. 2, other embodiments may utilize additional such layers with embedded capacitors. For example, to be more effective, the assembly of the dielectric layer 110 with embedded capacitors can be placed close to active devices mounted on one side of the circuit board. Another assembly of a dielectric layer with embedded capacitors can be placed close to active devices on the other side of the circuit board.

Further, as shown in FIG. 2, devices 130 are mounted on a planar surface of the circuit board 100. Signal traces 120 in the layer 102 route signals from the devices 130 to other points on the circuit board 100. Some of the signal traces 120 connect input/output (I/O) pins of the devices 130 to via pads 122 and 124. The via pads 122 and 124 are in turn connected to vias 126 and 128, respectively, which are passed generally vertically through the multiple layers of the circuit board 100.

Each embedded capacitor in the layer 110 has several dimensions, where one of those dimensions is the shortest dimension. The embedded capacitors are positioned between power reference layers 108, 112 of the circuit board 100 such that the shortest dimension of each embedded capacitor defines the distance or spacing between the power reference layers 108, 112.

In one embodiment, an embedded capacitor is shaped generally as a parallelepiped that has three dimensions (height, length, and width). More generally, the embedded capacitor can have various other geometric shapes that define at least a first dimension and a second dimension, where the second dimension is larger than the first dimension. The embedded capacitor is positioned such that the first dimension (the shortest or shorter dimension of all dimensions of the capacitor) defines the distance or spacing between power reference layers that sandwich the embedded capacitor.

Each embedded capacitor has electrically conductive electrodes that enable electrical connection to other components (such as power reference layers). The conductive electrodes of the embedded capacitor are positioned such that they face corresponding power reference layers. In other words, the conductive electrodes of the embedded capacitor are arranged such that they are generally parallel to the power reference layers. A capacitor electrode is considered to be "generally parallel" to a power reference layer if a major surface of the capacitor electrode is generally parallel to a major surface of the power reference layer. A "major surface" of a component, such as the capacitor electrode or power reference layer, refers to a larger (or largest) of various surfaces that are present on the component. "Generally parallel" means that substantial portions of two components are parallel to within manufacturing tolerances.

In the arrangement of the embedded capacitor and power reference layers discussed above, a first of the conductive electrodes of the embedded capacitor faces, and is electrically contacted with, a first of the power reference layers, while a second of the conductive electrodes of the embedded capacitor faces, and is electrically contacted with, a second of the power reference layers.

Internally, each embedded capacitor has plural conductive plates that sandwich plural dielectric layers to form an overall capacitance of the capacitor, as discussed below.

Figure 3:
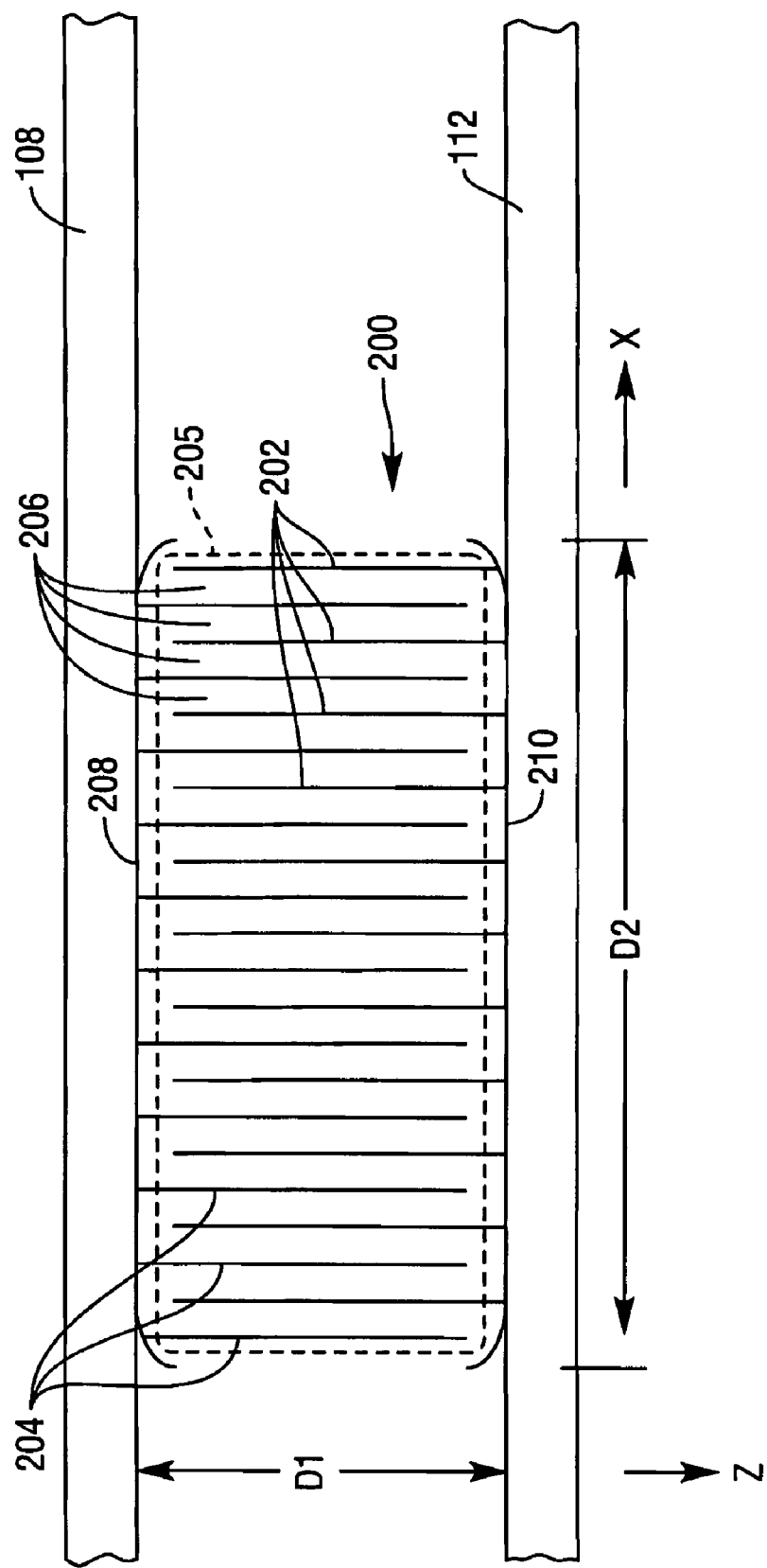
FIG. 3 illustrates components of an SMT capacitor according to an embodiment provided between power reference layers.

FIG. 3 shows an embedded capacitor 200 positioned between power reference layers 108 and 112. Internally, the capacitor 200 has a first set of conductive plates 202 and a second set of conductive plates 204. The conductive plates 202 and conductive plates 204 are interleaved with respect to each other such that each plate 202 (except for the outermost plate 202 on the right) is between two plates 204, and each plate 204 (except for the outermost plate 204 on the left) is between two plates 202. The first set of conductive plates 202 are electrically connected to each other, whereas the second set of conductive plates 204 are electrically connected to each other.

Dielectric layers 206 are provided (sandwiched) between each pair of a conductive plate 202 and a conductive plate 204. The assembly of a conductive plate 202, conductive plate 204, and a dielectric layer 206 provides a capacitance. The multiple assemblies that each includes a pair of conductive plates 202, 204, and a dielectric layer 206 sandwiched therebetween provide corresponding capacitances that collectively form the overall capacitance of the capacitor 200.

Conductive plates 202, 204 and dielectric layers 206 of the capacitor 200 are encapsulated in a housing 205 (indicated by dashed profile), which can be formed of an insulating material. The capacitor 200 includes a first conductive electrode 208 and second conductive electrode 210 that are provided outside the capacitor housing 205 to enable electrical connection between the electrodes 208, 210 and an external component. The electrode 208 electrically connects the set of conductive plates 204, and the electrode 210 electrically connects the set of conductive plates 202.

As depicted in FIG. 3, the capacitor 200 has a first dimension D1 and a second dimension D2, where D2>D1. In one implementation, the dimension D1 can be considered the width or height of the capacitor, and the dimension D2 can be considered the length of the capacitor. The embedded capacitor 200 is placed on its side between the power reference layers 108, 112 in the arrangement of FIG. 3 such that the shorter dimension D1 of the capacitor defines the distance or spacing between the power reference layers 108 and 112. Although a third dimension (D3) of the embedded capacitor 200 is not shown, in some embodiments, dimension D1 is smaller than both dimensions D2 and D3. In other embodiments, the third dimension D3 of the capacitor 200 can be smaller than dimension D1. If the dimension D1 of the capacitor 200 is the minimum dimension of the capacitor 200, then a minimum spacing between the power reference layers 108 and 112 can be achieved with the arrangement of FIG. 3 when the embedded capacitor 200 is positioned between the power reference layers.

The capacitor electrodes 208 and 210 are arranged such that they are generally parallel to the power reference layers 108 and 112. As a result, the electrode 208 faces, and is electrically contacted to, the power reference layer 108, while the other electrode 210 faces, and is electrically contacted to, the power reference layer 112. Since the capacitor electrodes 208 and 210 are generally parallel to the power reference layers 108 and 112, the electrodes 208 and 210 do not extend in an orientation that would have the possibility of shorting the power reference layers 108 and 112, a concern that exists with conventional SMT capacitors that are positioned on their sides when embedded between power reference layers in a circuit board.

Note that the capacitor electrodes 208 and 210 can be electrical contacted to the power reference layers 108 and 112 in one of several ways, such as by soldering, mechanical pressure, conductive adhesion, and so forth.

As depicted in FIG. 3, the capacitor electrodes 208 and 210 extend in a direction parallel to a first axis (referred to as the "x" axis), which is the axis of the second dimension D2 of the capacitor 200. In the arrangement of FIG. 3, the capacitor electrodes 208 and 210 are considered to extend along the length of the capacitor 200 (where the length is defined along the x axis). This is contrasted to conventional SMT capacitors in which the conductive electrodes extend along the width (direction z) of the capacitor 200.

Figure 4:
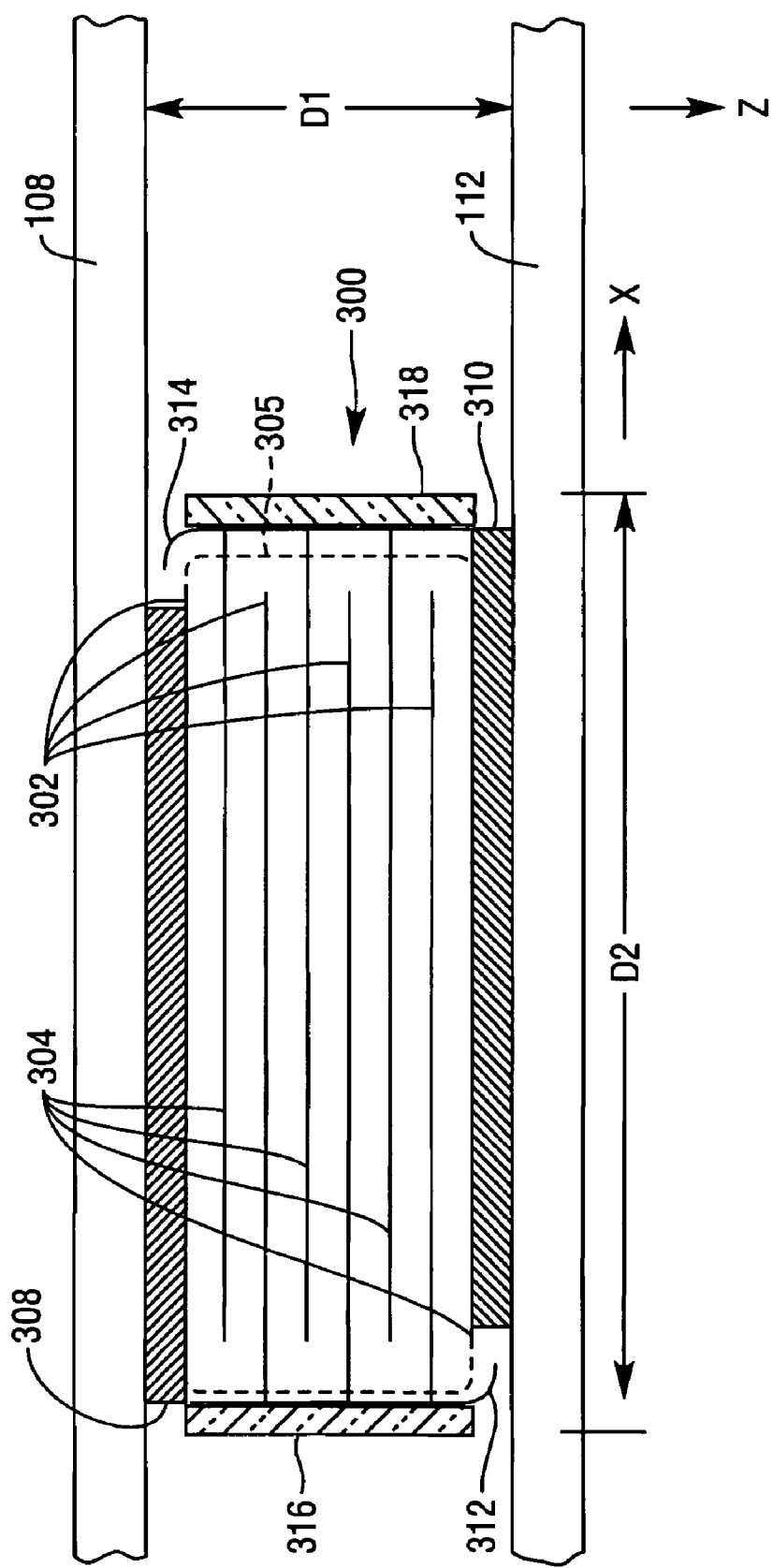
FIG. 4 illustrates components of an SMT capacitor according to another embodiment provided between power reference layers.

FIG. 4 shows another embodiment of a capacitor 300 that can be positioned between power reference layers 108 and 112 while achieving a reduced or minimum spacing between the power reference layers 108 and 112 of the circuit board. In the orientation of FIG. 4, the capacitor 300 is laid on its side such that the shorter dimension D1 of the capacitor 300 (shorter than dimension D2 of the capacitor 300) defines the spacing between the power reference layers 108, 112.

Internally, within a capacitor housing 305, the capacitor 300 has a first set of conductive plates 302 and a second set of conductive plates 304 that sandwich respective dielectric layers 306. The conductive plates 302 and 304 and dielectric layers 306 are similar to the conductive plates 202, 204, and dielectric layers 206 of the FIG. 3 capacitor except the conductive plates 302, 304, and dielectric layers 306 are rotated by about 90° with respect to the conductive plates 202, 204, and dielectric layers 206 of FIG. 3. In other words, the conductive plates 302, 304, and dielectric layers 306 of the capacitor 300 extend generally along the x direction, which is generally parallel to the power reference layers 108 and 112. In contrast, the conductive plates, 202, 204, and dielectric layers 206 in the FIG. 3 capacitor extends generally along the z direction.

Conductive electrodes 308 and 310 of the capacitor 300 are plated or otherwise attached to conductive plates 302, 304, respectively. More specifically, the upper conductive electrode 308 is attached (and electrically contacted to) the top conductive plate 302, and the lower conductive electrode 310 is attached, and electrically contacted to, the bottom conductive plate 304.

The first set of conductive plates 302 is electrically interconnected by an end cap 312, and the second set of conductive plates 304 are electrically interconnected by another end cap 314. Also, insulation layers 316 and 318 can be attached to the end caps 312 and 314 to prevent inadvertent shorting of the end caps 312, 314 to external components.

A benefit of using the configuration of FIG. 4 is that the conventional technology of manufacturing a conventional capacitor, such as a multi-layer ceramic capacitor, can be provided, with the end caps 308, 310 and insulation layers 316, 318 added.

Figure 5:
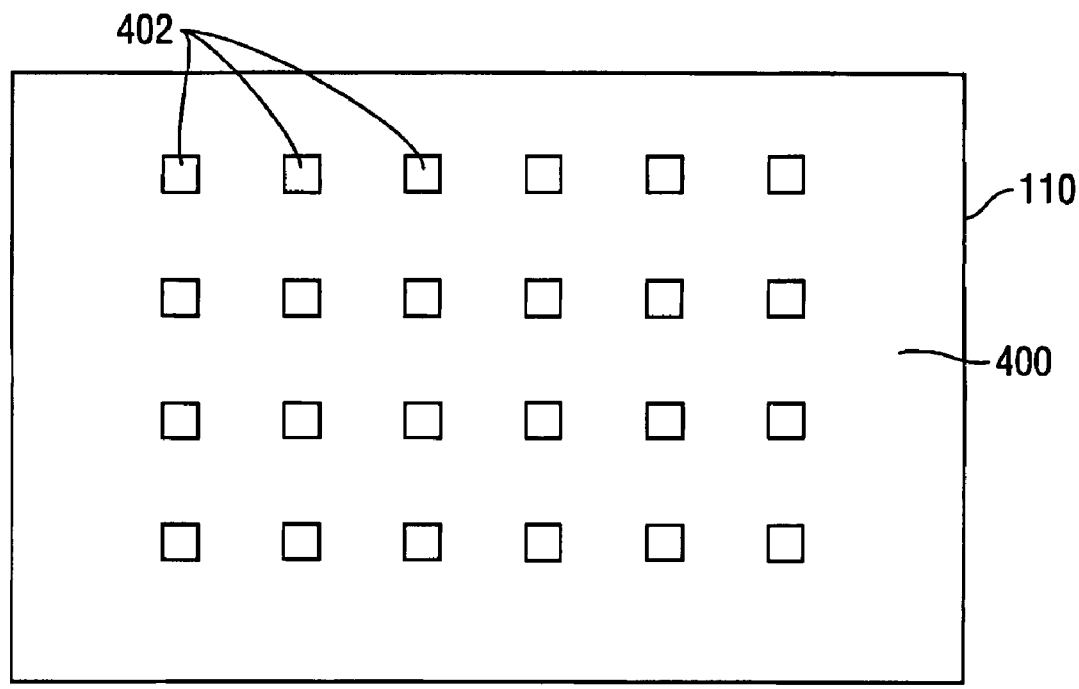
FIG. 5 is a top view of a circuit board core dielectric layer in which openings have been formed to provide a template to facilitate placement of embedded SMT capacitors, according to an embodiment.

FIG. 5 shows a top view of the dielectric layer 110 (see also FIG. 2) in which capacitors are embedded. The dielectric layer 110 has a top planar surface 400, and a bottom planar surface (not shown) in FIG. 5, which is on the opposite side of a dielectric layer 110 from the top surface 400. A plurality of openings 402 are formed through the dielectric layer 110. The openings (or holes) are formed to extend from the top or main surface 400 of the dielectric layer to the bottom surface of the dielectric layer such that the opening passes through the entire thickness of the dielectric layer 110. In the embodiment depicted in FIG. 5, each opening runs along a direction that is generally perpendicular to the top surface 400 of the dielectric layer 110. Although shown as being generally rectangular or square in shape, the openings 402 can have other shapes, such as circular, oval, triangular, or other shapes. Discrete embedded capacitors, such as capacitors 200 or 300 depicted in FIGS. 3 and 4, respectively, can be positioned in the openings 402.

By providing discrete capacitors that can be arranged to reduce or minimize spacing between power reference layers while avoiding the issue of shorting between the power reference layers, more compact circuit boards can be achieved while not substantially increasing complexity of constructing the circuit boards.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A circuit board comprising:
  power reference layers; and
  a capacitor provided between the power reference layers, wherein the capacitor has at least a first dimension and a second dimension that is larger than the first dimension, wherein the capacitor is positioned such that the first dimension defines a distance between the power reference layers, and wherein the capacitor comprises:
    plural conductive plates sandwiching plural dielectric layers; and
    a first conductive electrode electrically connected to a first subset of the plural conductive plates and facing a first of the power reference layers; and a second conductive electrode electrically connected to a second subset of the plural conductive plates and facing a second of the power reference layers, wherein the first conductive electrode and second conductive electrode extend in a direction that is generally parallel to the power reference layers, and wherein the conductive plates are generally parallel to the first and second conductive electrodes, wherein the first conductive electrode is attached to one of the plural conductive plates, and wherein the second conductive electrode is attached to another of the plural conductive plates, wherein a surface of the first conductive electrode is contacted to one of the power reference layers, and a surface of the second conductive electrode is contacted to another one of the power reference layers.

2. The circuit board of claim 1, wherein the capacitor further comprises a housing in which the plural conductive plates and dielectric layers are contained.

3. The circuit board of claim 1, wherein the power reference layers comprise a power supply voltage reference layer and a ground reference layer.

4. The circuit board of claim 1, wherein the plural conductive plates and plural dielectric layers provide multiple assemblies associated with corresponding capacitances, wherein each of the assemblies includes a conductive plate from the first subset, a conductive plate from the second subset, and a dielectric layer, and wherein an overall capacitance of the capacitor is collectively provided by the capacitances of the assemblies.

5. The circuit board of claim 1, wherein the first conductive electrode is plated to one of the plural conductive plates, and the second conductive electrode is plated to another of the plural conductive plates.

6. The circuit board of claim 1, wherein the first subset of conductive plates are electrically interconnected, and the second subset of conductive plates are electrically interconnected.

7. The circuit board of claim 6, wherein the capacitor further comprises a first end cap and a second end cap, and wherein the first end cap electrically interconnects the first subset of conductive plates, and the second end cap electrically interconnects the second subset of conductive plates, wherein the first and second end caps are distinct from the first and second conductive electrodes.

8. The circuit board of claim 7, further comprising insulating layers attached to the end caps to electrically isolate the end caps.

9. The circuit board of claim 1, wherein the capacitor has a length and a width, and wherein the capacitor is laid on its side between the power reference layers.

10. The circuit board of claim 1, further comprising a dielectric layer between the power reference layers, wherein the capacitor is embedded in the dielectric layer.

11. The circuit board of claim 10, wherein the dielectric layer has multiple openings, and wherein the capacitor is embedded in one of the openings of the dielectric layer, the circuit board further comprising additional capacitors embedded in other openings of the dielectric layer, the additional capacitors electrically connected between the power reference layers.

12. The circuit board of claim 1, wherein the surface of the first conductive electrode is directly physically contacted to the one of the power reference layers, and the surface of the second conductive electrode is directly physically contacted to the another one of the power reference layers.

* * * * *